(12) United States Patent
Takesako et al.

(10) Patent No.: US 6,556,880 B2
(45) Date of Patent: Apr. 29, 2003

(54) PRODUCTION SCHEDULE PLANNING DEVICE AND A METHOD OF PRODUCING A SEMICONDUCTOR DEVICE USING THE SAME

(75) Inventors: Norihiro Takesako, Tokyo (JP); Kazunori Morinaga, Tokyo (JP); Akihisa Chikamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/903,736

(22) Filed: Jul. 13, 2001

(65) Prior Publication Data

US 2002/0161465 A1 Oct. 31, 2002

(30) Foreign Application Priority Data

Apr. 25, 2001 (JP) .......................... 2001-127833

(51) Int. Cl.⁷ ................................................ G06F 19/00
(52) U.S. Cl. ........................................ 700/100; 700/101
(58) Field of Search .................................. 700/100–104

(56) References Cited

FOREIGN PATENT DOCUMENTS

JP          11-151640          6/1999

*Primary Examiner*—Leo Picard
*Assistant Examiner*—Michael D. Masinick
(74) *Attorney, Agent, or Firm*—McDermott, Will & Emery

(57) ABSTRACT

In a production schedule planning device, a schedule planning unit 4 recognizes a previous schedule as a prerequisite without obtaining a current progress and information of initial setups of processing devices by the schedule planning unit 4, whereby a schedule of a newly thrown lot can be planned without modifying and/or changing the previous schedule.

8 Claims, 9 Drawing Sheets

F I G. 6
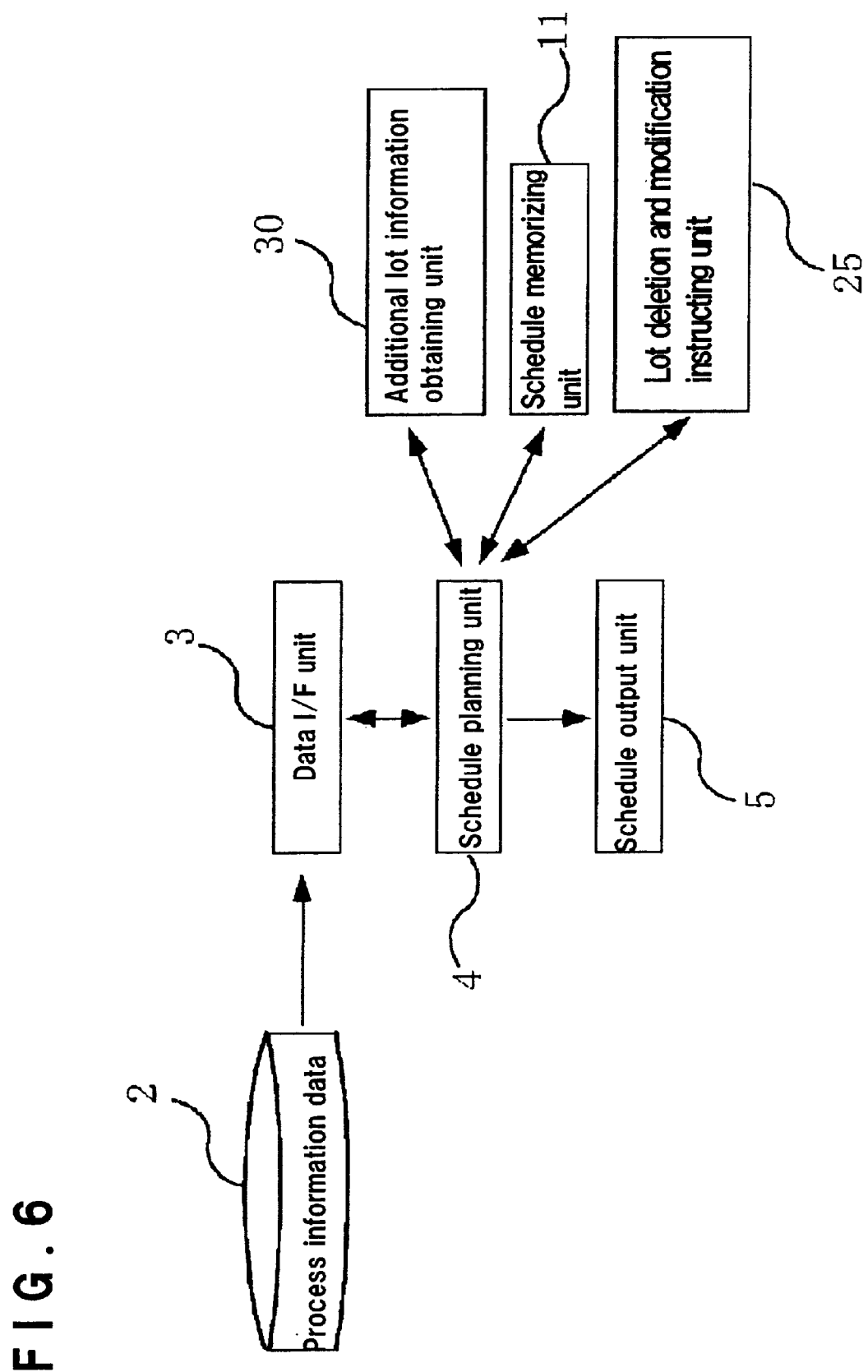

PRODUCTION SCHEDULE PLANNING DEVICE AND A METHOD OF PRODUCING A SEMICONDUCTOR DEVICE USING THE SAME

BACKGROUND OF THE INVENTION

1. Field of the Invention

The present invention relates to a production schedule planning device for scheduling a processing order and progress of products in various production lines, and a method of producing semiconductor devices using the same.

2. Discussion of Background

In general, a production schedule planning device, used in various production lines, receives results of progress in processing existing lots, which are momentarily changing, in addition to information of newly thrown products (i.e. lot), and repeatedly performs calculations of the plan based on the information. FIG. 8 illustrates a generally-used conventional production schedule planning device. In FIG. 8, numerical reference 1 designates data of past result information, which are data of progress in processing lots, and numerical reference 2 designates data of process information, obtained in processing the lots. These data 1 and 2 are usually held in a system other than the production schedule planning device, wherein the production schedule planning device has a data interface unit (hereinbelow, referred to as data I/F), designated by numerical reference 3. A schedule planning unit 4 plans and calculates a production schedule based on data, obtained from the data 1 of the past result information and the data 2 of the processing information. Numerical reference 5 designates a schedule outputting unit, which outwardly outputs the schedule, planned in the schedule planning unit 4.

FIG. 9 illustrates a processing flow of the conventional production schedule planning device, which is generally used. In step S6, information of the newly thrown lot is obtained. In step S7, past progress of the existing lots is obtained. In step S8, information of processes of these lots is obtained. In step S9, a production schedule is planned based on the information. Thereafter, in step S10. The plan is outputted.

The generally-used production schedule planning device plans the schedule based on the information of progress of the products. Therefore, when a lot is newly added and/or a difference between a schedule and a past result happens, there are problems that the schedules for all lots should be reviewed, and a time for calculating the schedules is drastically increased. Further, schedules for other than the products, of which past results differ from the schedules, are also changed, whereby the schedules are changed from those in an initial stage of the plan, and confusion is caused to production lines.

SUMMARY OF THE INVENTION

It is an object of the present invention to solve the above-mentioned problems inherent in the conventional technique and to provide the production schedule planning device having a data interface unit for receiving data from an outside; a schedule planning unit for planning and calculating a production schedule based on the external data, obtained from the data interface unit; and a schedule outputting unit for outwardly sending the schedule, planned in the schedule planning unit, wherein the production schedule planning device has a function of planning a schedule for newly thrown lots without making the schedule planning unit obtain current progress and/or information of initial setups of processing devices and without modifying and/or changing a previous schedule by recognizing the previous schedule as a postulate.

According to a second aspect of the present invention, there is provided the production schedule planning device, in which the schedule planning unit has time axes respectively for the processing devices and also has a function of scheduling while inserting space times in the schedule, which space times are generated by predetermined timing.

According to a third aspect of the present invention, there is provided the production schedule planning device further comprising: a lot-deletion and modification instructing unit for deleting data of unnecessary lots and lots to be modified in the previous schedule.

According to a fourth aspect of the present invention, there is provided a method of producing semiconductor devices using the production schedule planning device, described in any one of the first through the third aspects of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 illustrates a structure of a production schedule planning device according to Embodiment 3 of the present invention;

DETAILED DESCRIPTION OF THE PREFERRED EMBODIMENTS

A detailed description will be given of preferred embodiments of the present invention in reference to FIGS. 1 through 7 as follows, wherein the same numerical references are used for the same or similar portions and description of these portions is omitted.

Embodiment 1

Figure 1:
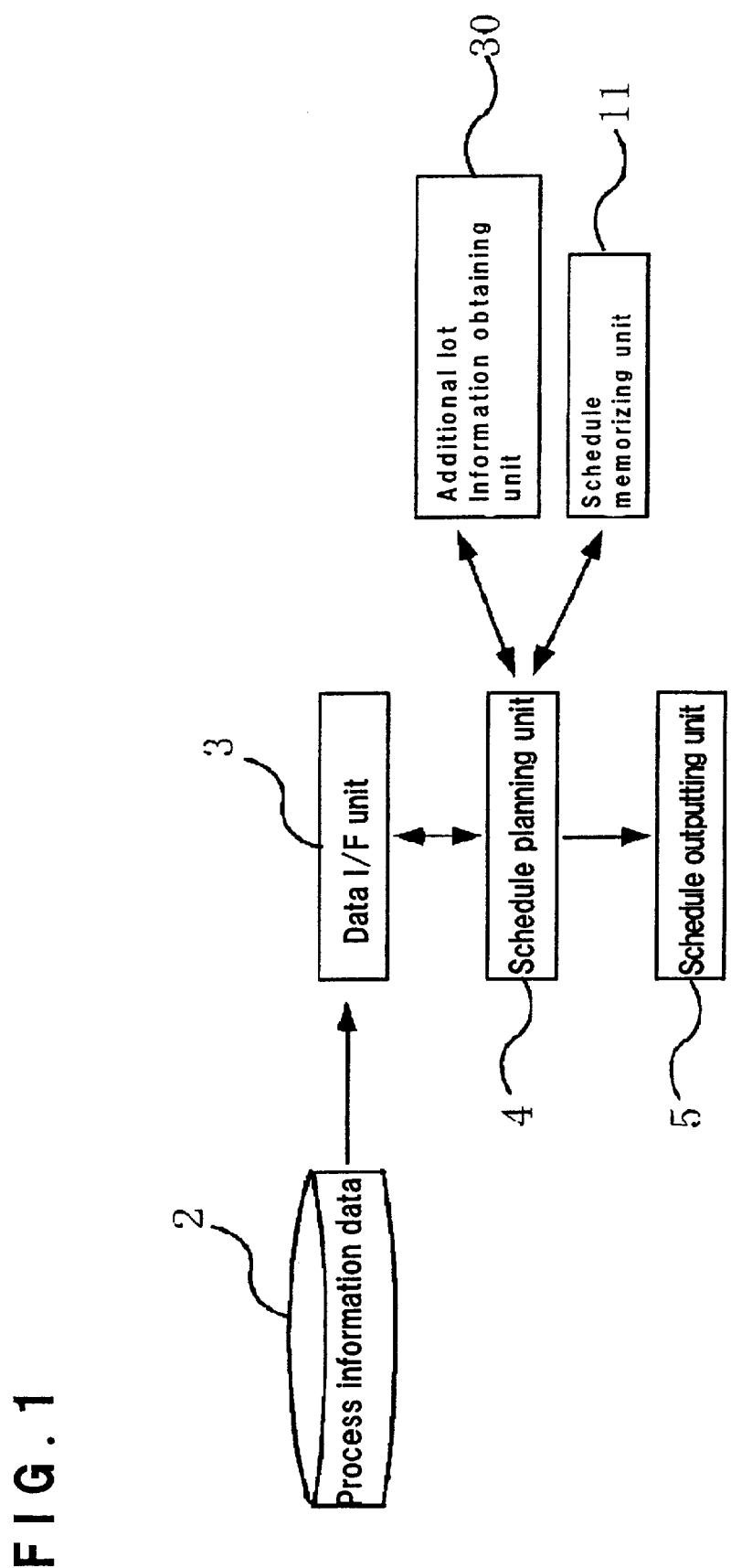
FIG. 1 illustrates a structure of a production schedule planning device according to Embodiment 1 of the present invention.

FIG. 1 illustrates a structure of a production schedule planning device, according to Embodiment 1 of the present invention. In reference of FIG. 1, numerical reference 2 designates process information data, being information data concerning a process of a lot. The process information data 2 are usually held in a system other than the production schedule planning device, and the production schedule planning device has a data interface unit (i.e. data I/F), designated by the numerical reference 3. A schedule planning unit 4 plans and calculates a production schedule based on the data, obtained from the process information data 2. Numerical reference 5 designates a schedule outputting unit for outwardly outputting the schedule, planned in the schedule planning unit 4. Further, numerical reference 11 designates a schedule memorizing unit for memorizing the schedules, which are previously or further previously planned. Numerical reference 30 designates an additional lot information obtaining unit for obtaining data of lots, which are newly and additionalily scheduled.

Figure 2:
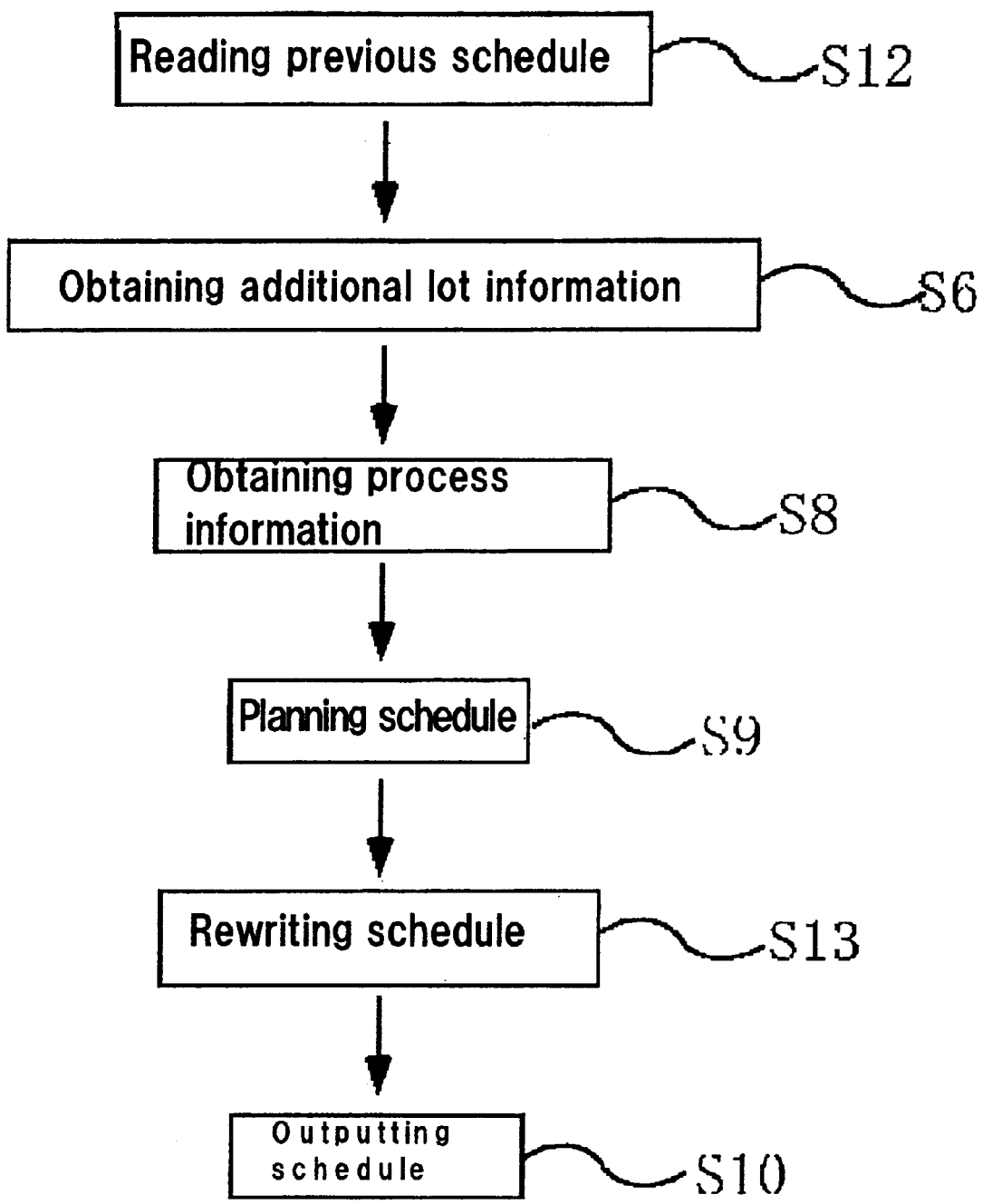
FIG. 2 illustrates a processing flow by the production schedule planning device according to Embodiment 1 of the present invention.
Figure 3:
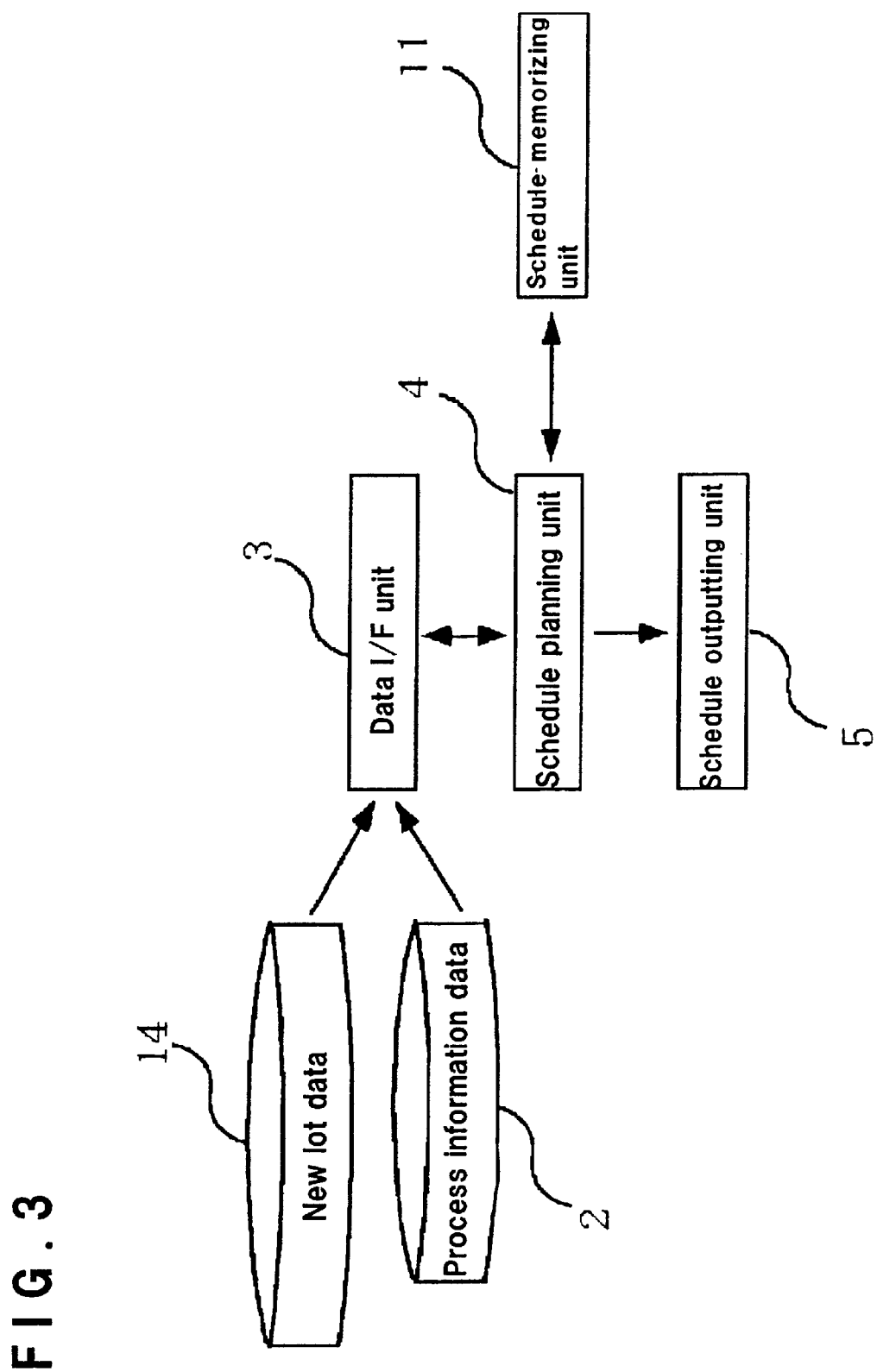
FIG. 3 illustrates a structure of another production schedule planning device according to Embodiment 1 of the present invention.

FIG. 2 illustrates a process flow by the production schedule planning device according to Embodiment 1 of the present invention.

In reference of FIGS. 1 and 2, the previously planned schedule (i.e. previous schedule) is read by the schedule planning unit 4 out of the schedule memorizing unit 11 in step S12. In step S6, data of a lot, newly and additionalily scheduled, are obtained from the additional lot information obtaining unit 30. However, when the production schedule planning device is constructed as in FIG. 3, and data of a newly thrown unit (i.e. new lot data 14) are separately controlled, the additional lot information obtaining unit 30 becomes unnecessary. In step S9, the schedule is planned, wherein the previous schedule, read in the step S12, is recognized as a condition, and a production schedule of the new lot is added without changing the previous schedule. Thereafter, the schedule is memorized in the step S13, and the schedule is outputted in step S10, whereby a sequence of the process is completed.

As described, by the production schedule planning device according to Embodiment 1, the lot subjected to the plan in step S9 is that newly thrown. Therefore, a time for scheduling is drastically reduced, and the schedules previously planned and outputted are not changed, whereby there is no sudden change of preestablishment, and a production line is not confused.

Embodiment 2

Figure 4:
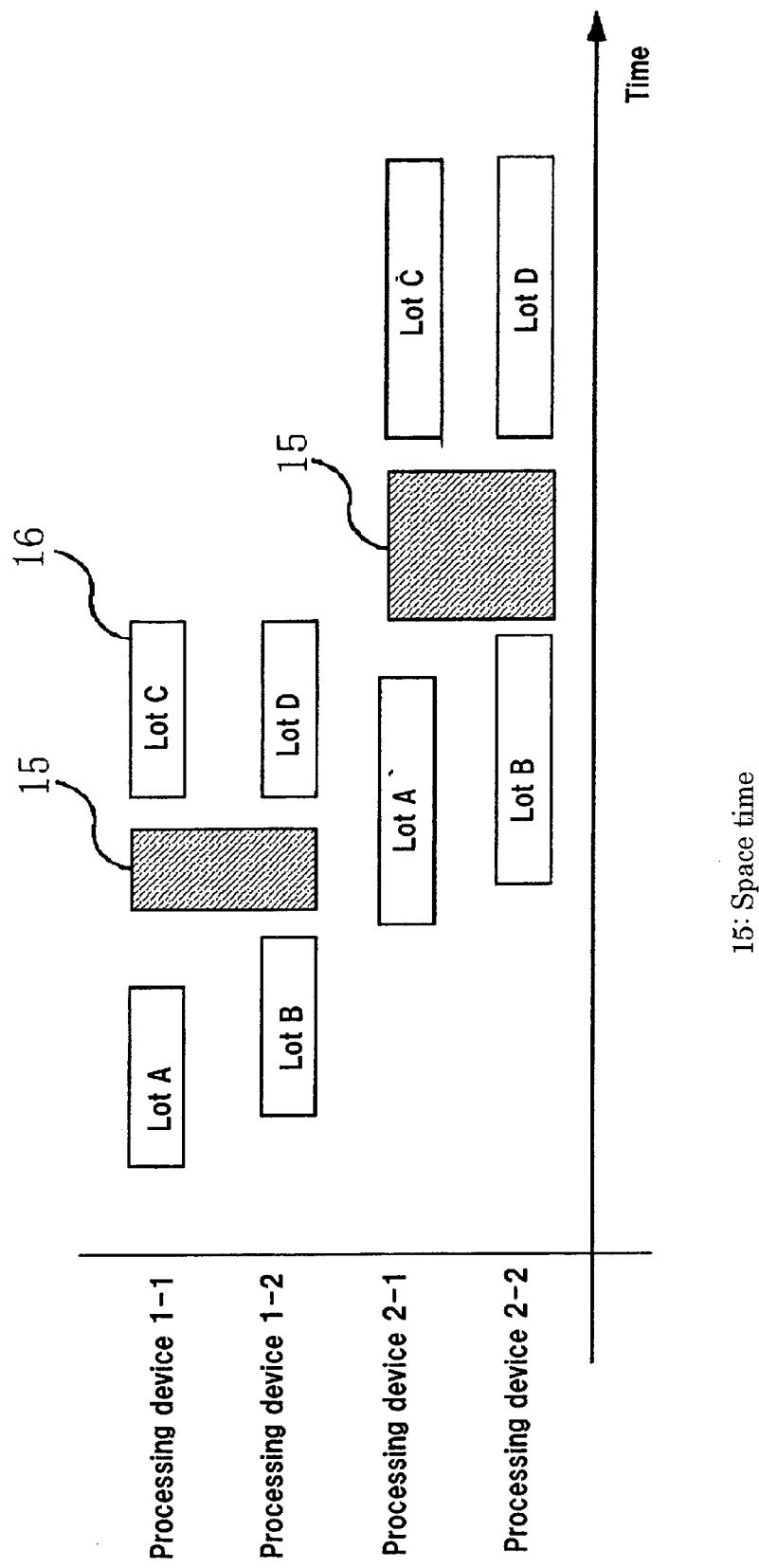
FIG. 4 is a Gantt Chart illustrating output results from a production schedule planning device according to Embodiment 2 of the present invention.

FIG. 4 is a Gantt Chart illustrating output results from the production schedule planning device according to Embodiment 1, being further provided with a countermeasure for a case that a process of products are not in progress as scheduled. Numerical reference 16 designates a lot, scheduled in a processing device, wherein a length of a box represents a processing time. By estimating a processing capability of the processing device less than 24 hours/day, a space time designated by numerical reference 15 is formed, and a condition is given so as not to allocate a process of the lots. There is a characteristic that a time axis is given to the space times, and the space times are generated by predetermined timing. Even though a lot is not in progress as scheduled, the lot is processed in use of the space time to recover a production, whereby the other lots are not affected.

Figure 5:
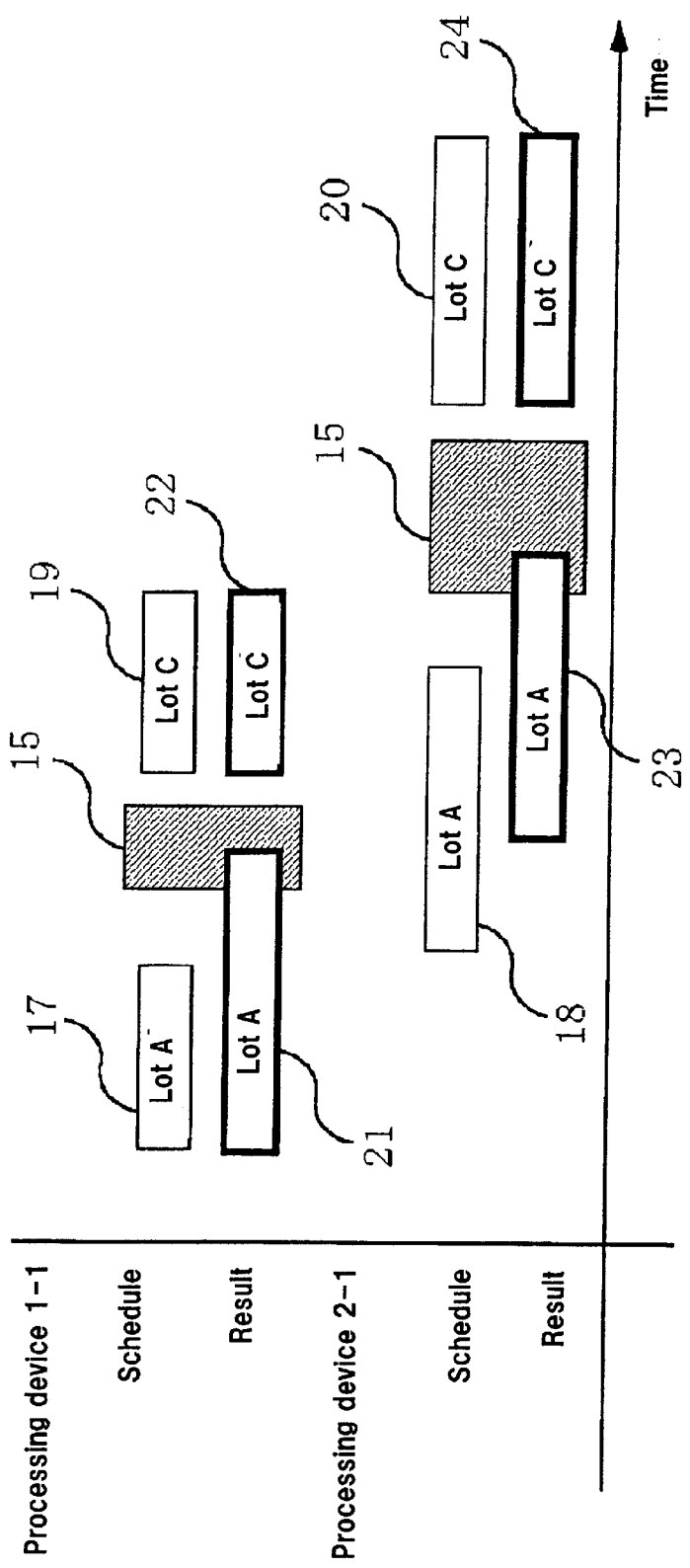
FIG. 5 illustrates a case that space times absorb delays of lots in the production schedule planning device according to Embodiment 2 of the present invention.

FIG. 5 illustrates a case that the space time absorbs a delay of a lot. FIG. 17 designates a schedule time processed by a processing device 1—1 of lot A, and numerical reference 18 designates a schedule processed by a processing device 2-1 of the lot A. In a similar manner thereto, numerical reference 19 designates a schedule processed by a processing device 1—1, and numerical reference 20 designates a schedule processed by a device 2-1 of the lot C. Although numerical reference 21 designates past results of the process by the processing device 1—1 of the lot A, even when the processing time of the lot A is in inconformity with preestablishment shown in the numerical reference 17 by a certain trouble, the space time 15 absorbs this inconformity, whereby the process 22 of the lot C is not affected. Further, even though a processing start time is delayed as in a numerical reference 23, a succeeding lot C, is not affected.

As described, according to the production schedule planning device in Embodiment 2, since the above-described function is given to the schedule planning unit 4, described in Embodiment 1, and the schedule previously or further previously planned can be used to process the production without considering past results in processing the lot, it is unnecessary to repeatedly schedule existing lots, and therefore a time for scheduling the process can be drastically reduced. Further, the schedules are not suddenly changed, and a production line is not confused.

Embodiment 3

A structure of a production schedule planning device according to Embodiment 3 has a lot-deletion and modification instructing unit 25, illustrated in FIG. 6, in addition to the structures of the production schedule planning devices, described in Embodiments 1 and 2. By removing an existing lot, which can not be processed by a reason such as defects in a production, a useless schedule can be eliminated, an accuracy of the schedule can be improved, and a time for scheduling can be shortened. Further, when the previous schedule is required to be modified, it can be once deleted from the previous schedule, and re-scheduled like a new lot, whereby the modification of the schedule is enabled.

Figure 7:
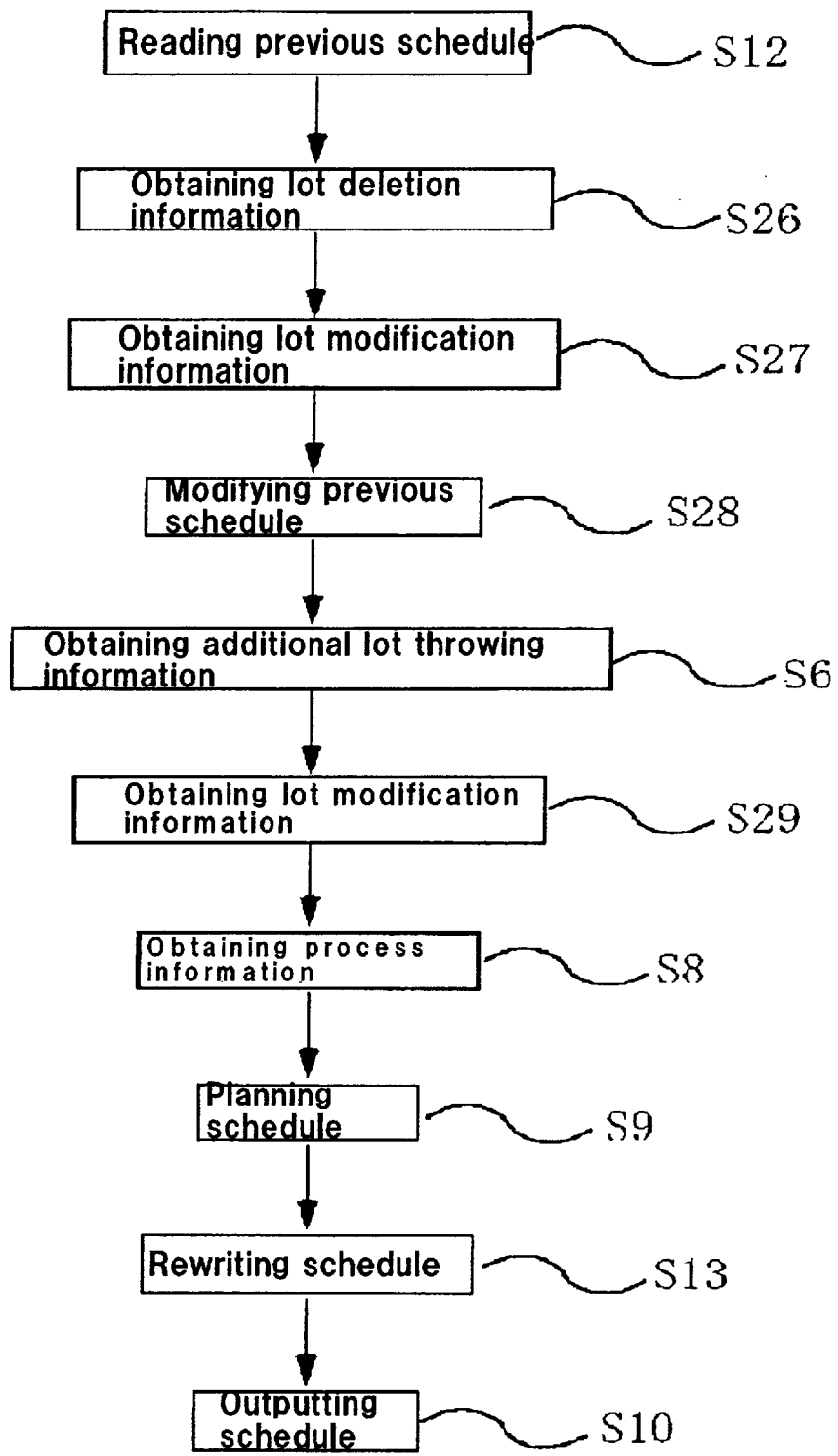
FIG. 7 illustrates a processing flow by the production schedule planning device according to Embodiment 3 of the present invention.
Figure 8:
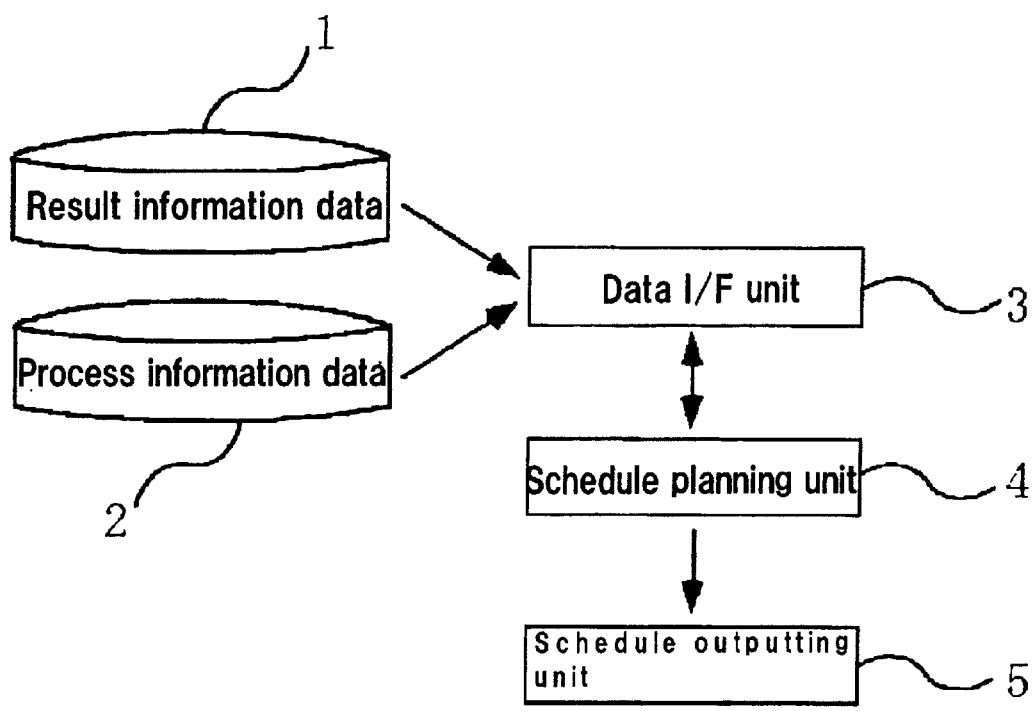
FIG. 8 illustrates a structure of a conventional production schedule planning device, which is generally used.
Figure 9:
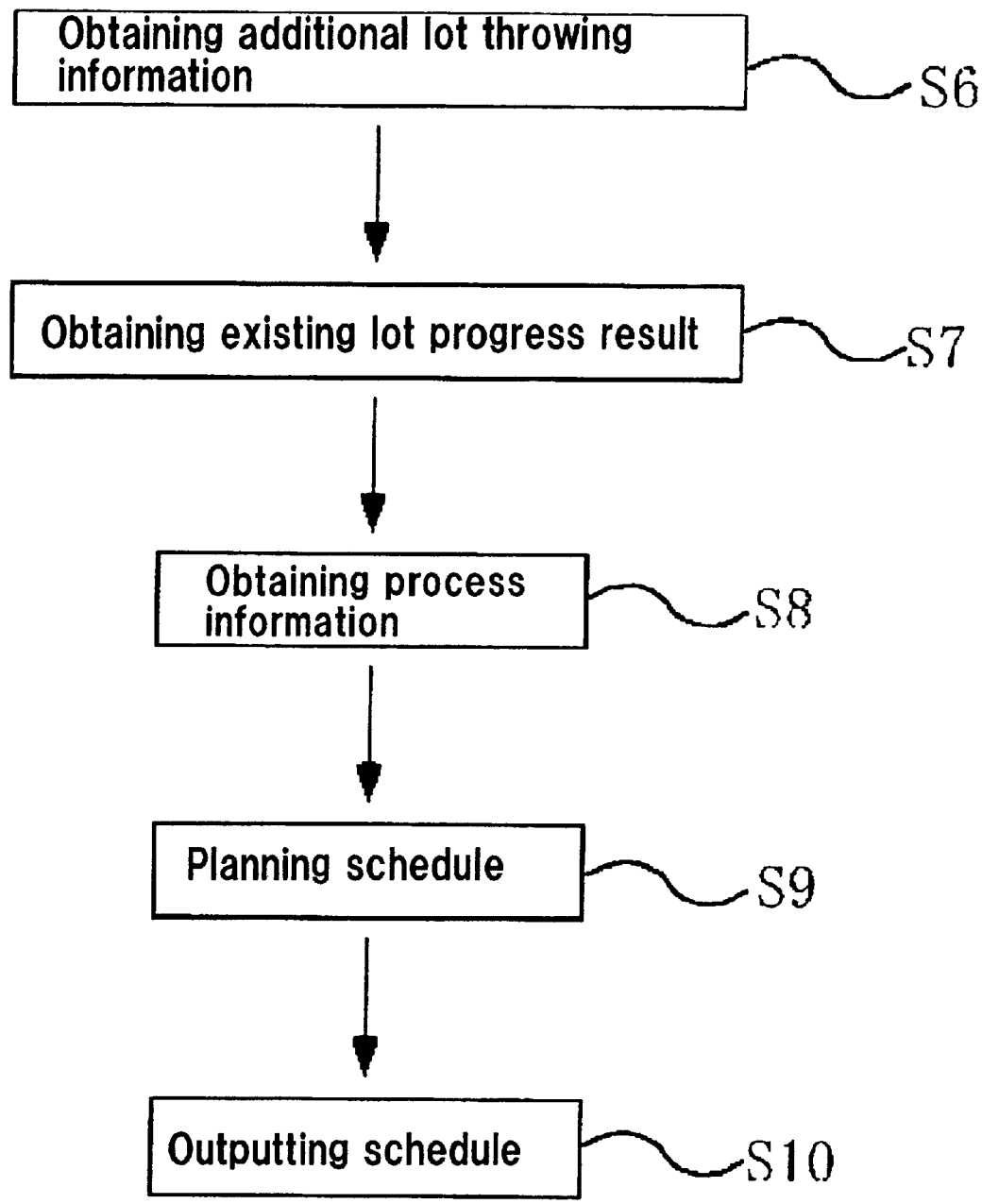
FIG. 9 illustrates a processing flow by the conventional production schedule planning device, which is generally used.

FIG. 7 illustrates a processing flow by the production schedule planning device according to Embodiment 3 of the present invention. After reading the previous schedule in step S12, a deleting lot is read in step S26, and a modifying lot is read in step S27. Succeedingly, in step S28, the deleting lot and the modifying lot are eliminated from the previous schedule. Thus eliminated becomes a condition, which is used in planning the schedule in step S9. Thereafter, information of a new lot is obtained in step S6, information of the modifying lot is recognized as a lot, subjected to schedule planning in step S29, and the schedule is planned in step S9. Thereafter, the previous schedule is rewritten in step S13, and the process is finished by outputting in step S10.

Embodiment 4

It is possible to produce semiconductor devices in accordance with a production plan, which is planned in use of the production schedule planning device described in any one of Embodiments 1 through 3. The semiconductor devices can be produced without causing a sudden change of preestablishment and a confusion in a production line.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2001-127833 filed on Apr. 25, 2001 including specification, claims, drawings and summary are incorporated herein by reference in its entirety.

What is claimed is:

1. The production schedule planning device comprising:
   a data interface unit for receiving data from an outside;
   a schedule planning unit for planning and calculating a production schedule based on the external data obtained from the data interface unit; and a schedule outputting unit for outwardly sending the schedule planned in the schedule planning unit, wherein the production schedule planning device has a function of planning a schedule for newly thrown lots without making the schedule planning unit obtain at least one of current progress and/or information of initial setups of processing devices and without at least one of modifying and/or changing a previous schedule by recognizing the previous schedule as a postulate.

2. The production schedule planning device according to claim 1, wherein the schedule planning unit has time axes respectively for the processing devices and also has a function of scheduling while inserting space times in the schedule, which space times are generated by predetermined timing.

3. The production schedule planning device according to claim 1, further comprising:

a lot-deletion and modification instructing unit for deleting data of unnecessary lots and lots to be modified in the previous schedule.

4. The production schedule planning device according to claim 2, further comprising:

a lot-deletion and modification instructing unit for deleting data of unnecessary lots and lots to be modified in the previous schedule.

5. A method of producing semiconductor devices using the production schedule planning device according to claim 1.

6. A method of producing semiconductor devices using the production schedule planning device according to claim 2.

7. A method of producing semiconductor devices using the production schedule planning device according to claim 3.

8. A method of producing semiconductor devices using the production schedule planning device according to claim 4.

* * * * *